United States Patent [19]

Bazes

[11] Patent Number: 4,499,428
[45] Date of Patent: Feb. 12, 1985

[54] IC DELAY CONVERSION OPERATIONAL AMPLIFIER

[75] Inventor: Mel Bazes, Haifa, Israel

[73] Assignee: Intel Corporation, Santa Clara, Calif.

[21] Appl. No.: 529,212

[22] Filed: Sep. 6, 1983

[51] Int. Cl.³ .............................. H03F 3/38; H03F 3/16
[52] U.S. Cl. ...................................... 330/10; 330/277
[58] Field of Search ................. 330/10, 277, 289, 307; 329/126, 137

[56] References Cited

FOREIGN PATENT DOCUMENTS 2516679  4/1975  Fed. Rep. of Germany ...... 329/137

Primary Examiner—James B. Mullins
Assistant Examiner—G. Wan
Attorney, Agent, or Firm—Blakely, Sokoloff, Taylor & Zafman

[57] ABSTRACT

An operational amplifier suitable for MOS fabrication is described. The amplifier operates adequately over a large range of process, temperature and voltage supply variations. Two identical delay lines are employed in the amplifier. One controls the frequency of oscillation of an oscillator. The oscillator's output is used to control a sample-and-hold circuit, is delayed through the second delay circuit, and is used through a gate circuit to provide a sampled potential for the sample-and-hold circuit.

13 Claims, 5 Drawing Figures

IC DELAY CONVERSION OPERATIONAL AMPLIFIER

BACKGROUND OF THE INVENTION

1. Field of the Invention

The invention relates to the field of MOS integrated circuit operational amplifiers.

2. Prior Art

The characteristics of metal-oxide-semiconductor (MOS) and complementary MOS integrated circuits vary considerably with temperature, power supply potential and normal processing variations. Consequently, these circuits are primarily used for binary signals and not analog signals. However, even in digital circuits, some analog signals are needed and require special care in designing because of the variations in characteristics. For instance, in memories employing floating gate devices, a regulated higher programming potential is used for programming and erasing. If this potential is to be developed on-chip from the lower power supply potential (e.g., 5 volts), a regulator circuit with an operational amplifier is used. (See copending application, Ser. No. 462,192 filed Jan. 31, 1983, entitled "MOS Divider Structure", which is assigned to the assignee of the present invention.) Analog-to-digital converters are another example of a class of circuits using analog signal processing. Also, certain filtering is most effectively done in analog form, and even where switched capacitor circuits are used, operational amplifiers are needed (see U.S. Pat. No. 4,168,440).

Operational amplifiers are a fundamental building block in both bipolar and MOS analog circuits. Often, these circuits use a differential input amplifier followed by one or more stages of voltage amplification and level shifting, and finally, an output buffer. These circuits are highly sensitive to variations in power supply potential, temperature and processing as mentioned. Adequate performance is generally only achieved over a limited operating range. Such prior art circuits most often require relatively large amounts of power and reducing this power consumption sacrifices performance. Additionally, compensation for stable closed loop operation is difficult.

As will be seen, the present invention provides an MOS operational amplifier which employs voltage controlled delay lines as control elements in the amplifier. Voltage controlled delay lines have been used by the inventor of the present invention for generating accurate timing signals (see copending application, Ser. No. 447,231 filed Dec. 6, 1982, entitled "Synchronous Delay Line", which is assigned to the assignee of the present invention).

SUMMARY OF THE INVENTION

A novel realization of an operational amplifier based on delay comparison is described. The amplifier is particularly suitable for MOS technology since the amplifier provides adequate performance over a large range of supply voltage, temperature and processing variations.

In the preferred embodiment, the amplifier is realized using two identical voltage-controlled delay circuits. A first input is coupled to one of these circuits to control the delay. This delay is used in a voltage controlled oscillator to provide a clocking signal, the frequency of which is a function of the delay. The clocking signal is applied to one terminal of an exclusive NOR gate and to the other terminal of the exclusive NOR gate after being delayed through the second voltage controlled delay circuit. The delay in the second circuit is controlled by a second input to the amplifier. The output of the gate is sampled by a sample-and-hold circuit. The rate of sampling is controlled by the clocking signal. A lowpass filter is coupled to the output of the sample-and-hold means to provide a filtered output.

DETAILED DESCRIPTION OF THE INVENTION

An MOS integrated circuit operational amplifier is disclosed. The amplifier is particularly suited for MOS technology since it provides adequate performance over a large range of variations in supply voltage, temperature and processing. Its low power requirements make it attractive for implementation in complementary MOS technology.

In the following description, numerous specific details are set forth such as specific circuits. It will be understood by one of ordinary skill in the art that the invention may be practiced without these specific details. Well-known MOS processing is not described in this application since the present invention may be fabricated with numerous well-known processes.

BLOCK DIAGRAM OF FIG. 1

Figure 1:
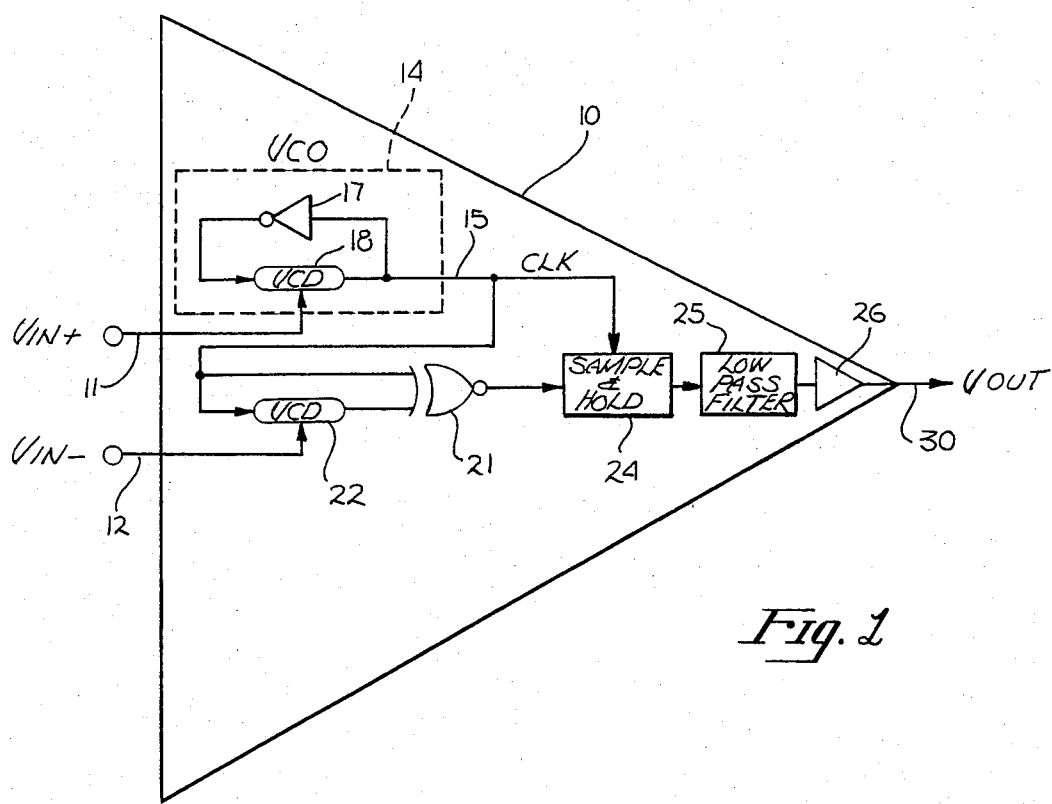
FIG. 1 is a block diagram used to describe the theory of operation of the present invention.

Referring to FIG. 1, a block diagram of the invented amplifier is shown within the amplifier symbol 10. The inputs to the operational amplifier are lines 11 and 12, one designated $V_{IN+}$ and the other $V_{IN-}$ respectively. The output from the amplifier is line 30.

The voltage-controlled delay (VCD) circuits 18 and 22 provide delays of a signal entering the circuit by an amount of time determined by the potential applied to these circuits on lines 11 and 12, respectively. The greater the control voltage on lines 11 and 12, the greater the delay, although no other assumptions are made about the relationship between delay and control voltage. This relationship in fact need not be linear, and furthermore, may vary with supply voltage, temperature and processing. However, since the VCD circuits 18 and 22 have the same layout (that is, they are identical) and are fabricated at the same time on the same chip, the delays produced by each of the circuits will be substantially identical under all conditions of supply voltage and temperature. This characteristic of the VCD circuits is significant since it provides the stability for the amplifier of FIG. 1. The delays for circuits 18 and 22 may be realized by controlling the rate of charging or discharging of capacitors; the preferred implementation is described in conjunction with FIG. 3.

The output of the circuit 18 is coupled to its input through an inverter 17. The delay circuit 18 and inverter 17 thus form a voltage controlled oscillator (VCO) 14. The frequency of oscillation of VCO 14 is an inverse function of the applied control voltage on line 11. That is, increasing the input potential on line 11 decreases the frequency of oscillation and vice versa. The actual frequency of oscillation is not critical, and it will be affected considerably by processing variations, supply voltage variations and temperature. However, these variations do not affect the basic operation of the amplifier of FIG. 1. The output from the VCO 14 is a clocking signal used within the amplifier (line 15).

OPERATION OF CIRCUIT OF FIG. 1

The clocking signal on line 15 is coupled to one input terminal of the exclusive NOR gate 21, the input to the VCD 22 and to the sample-and-hold circuit 24 to control the sampling rate. In effect, the output of the VCD 22 is compared with its input by the gate 21. Until the input signal propagates through the VCD circuit 22, the input and output are of opposite polarities, and the output of the exclusive NOR gate 21 is low. When the input to the circuit 22 completes its propagation, both of the inputs to gate 21 are equal (either low or high), and the output of the gate 21 goes high.

The output of the gate 21 is sampled by the sample-and-hold circuit 24, and the sample retained by this circuit is coupled from the circuit 24 through a lowpass filter 25. The output of filter 25 is buffered or amplified through buffer 26 and then coupled to the output line 30.

Figure 2:
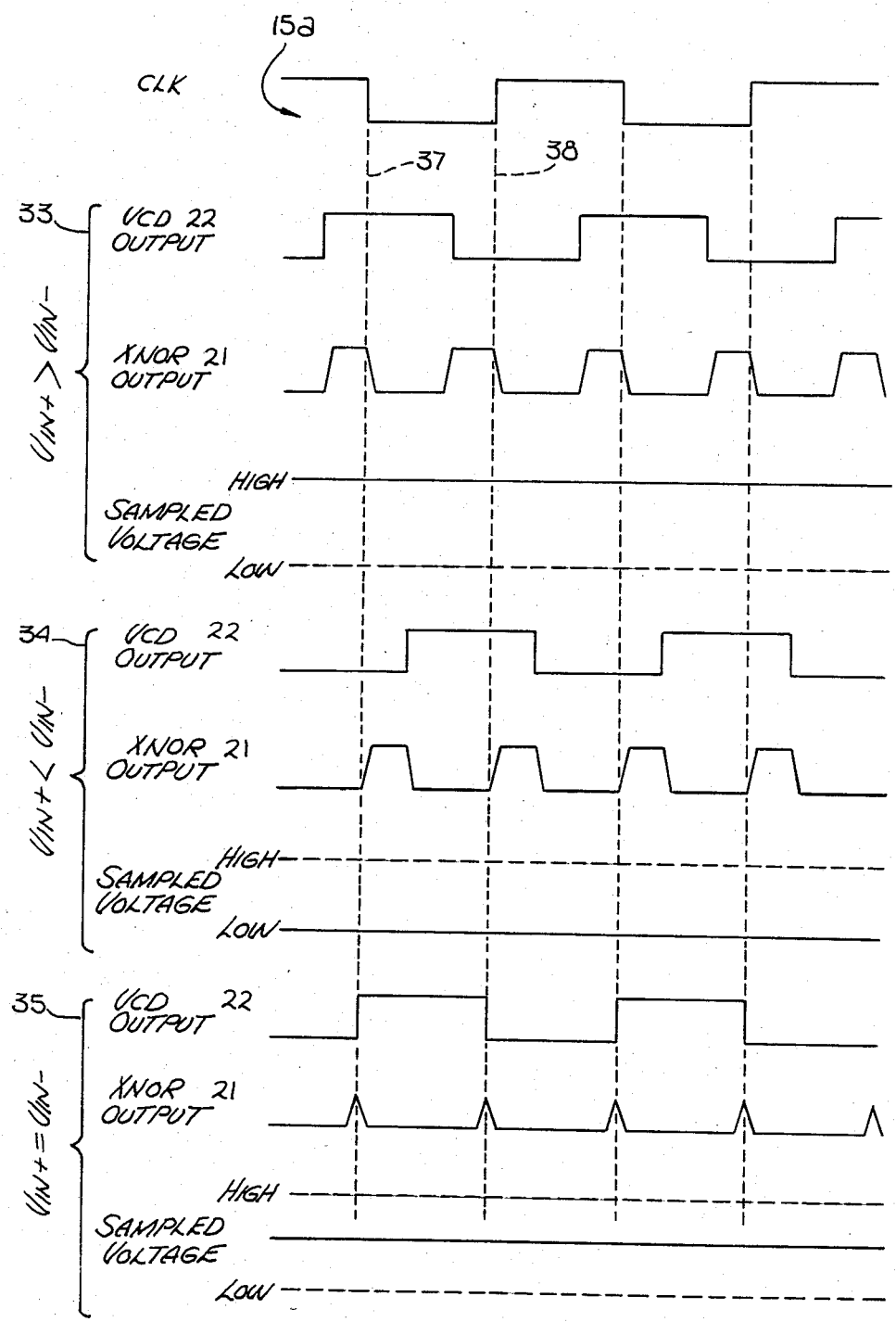
FIG. 2 is a series of waveforms used to describe the operation of the amplifier of FIG. 1.

The sample-and-hold circuit 24 samples the output of the gate 21 on each transition of the clocking signal on line 15. Referring to FIG. 2, the clocking signal is shown as waveform 15a; two transitions of this signal are shown at times 37 and 38. Sampling at the output of the gate 21 occurs at times 37 and 38 and at times of like transitions.

Three conditions can be sampled by the sample-and-hold circuit 24 at the output of gate 21. The output of the gate can be high, low or in transition between these states. These three conditions correspond to the relative magnitudes of the two input signals to the amplifier, that is, $V_{IN+}$ can be less than or greater than $V_{IN-}$, or the two inputs can be equal.

Assume first that $V_{IN+}$ is greater than $V_{IN-}$ by at least some small voltage differential. The waveforms for this condition are shown within bracket 33 of FIG. 2. For purposes of explanation, this condition may be more intuitively understood by imagining the delay of circuit 18 being long, the clock pulses being extended, and the delay through circuit 22 being short. The instant before the transition occurs on line 15, the output of the gate 21 is high, since both inputs to gate 21 are the same. This is true since the delay through circuit 22 is shorter than the clock period. When the transition occurs on line 15, the sample-and-hold means 24 samples the output of the gate 21 which is high. For instance, at time 37 of FIG. 2, for the waveforms within bracket 33, the output of the gate 21 is high. (Note that it immediately drops after the sampling since one of the inputs to the gate 21 changes state.) Thus, the sample voltage for this condition is high.

If we assume next that $V_{IN+}$ is less than $V_{IN-}$ by some small potential, an opposite result occurs. This condition is more easily understood by visualizing the clock periods as being short when compared to the delay through circuit 22. An instant before the transition of the clock signal occurs on line 15, the output of gate 21 is low since the previous transition has not propagated through circuit 22. The waveforms for this condition are shown within bracket 34 of FIG. 2. Each time the output of the gate 21 is sampled by the sample-and-hold means 24, the output of the gate is low, although it rises immediately after the sampling since one of the inputs to the gate changes on the transition.

In the final case, $V_{IN+}$ is approximately equal to $V_{IN-}$. The instant before the sampling occurs, the output of gate 21 is just beginning to rise since sufficient time has elapsed for the previous clock transition to propagate through the circuit 22. This results in a sampled voltage somewhere between the high potential and low potential as shown by the waveforms within bracket 35 of FIG. 2. If we assume for this condition that the difference between the approximately equal input potentials is "e", a voltage equal to "Ae" will be sampled where A is the voltage gain of the amplifier. If the maximum voltage swing at the output of the gate 21 is $V_S$, then $V_S = 2e_{max}A$, where $e_{max}$ is the maximum input differential that can be amplified before the amplifier "saturates".

GENERAL CHARACTERISTICS OF OPERATIONAL AMPLIFIER OF FIG. 1

The lowpass filter 25 in the presently preferred embodiment creates an S-plane dominant pole within the frequency response of the amplifier. This assures stability in closed loop operation. It also serves to filter the output of the sample-and-hold circuit, which contains the high frequency components associated with the sampling.

Figure 4:
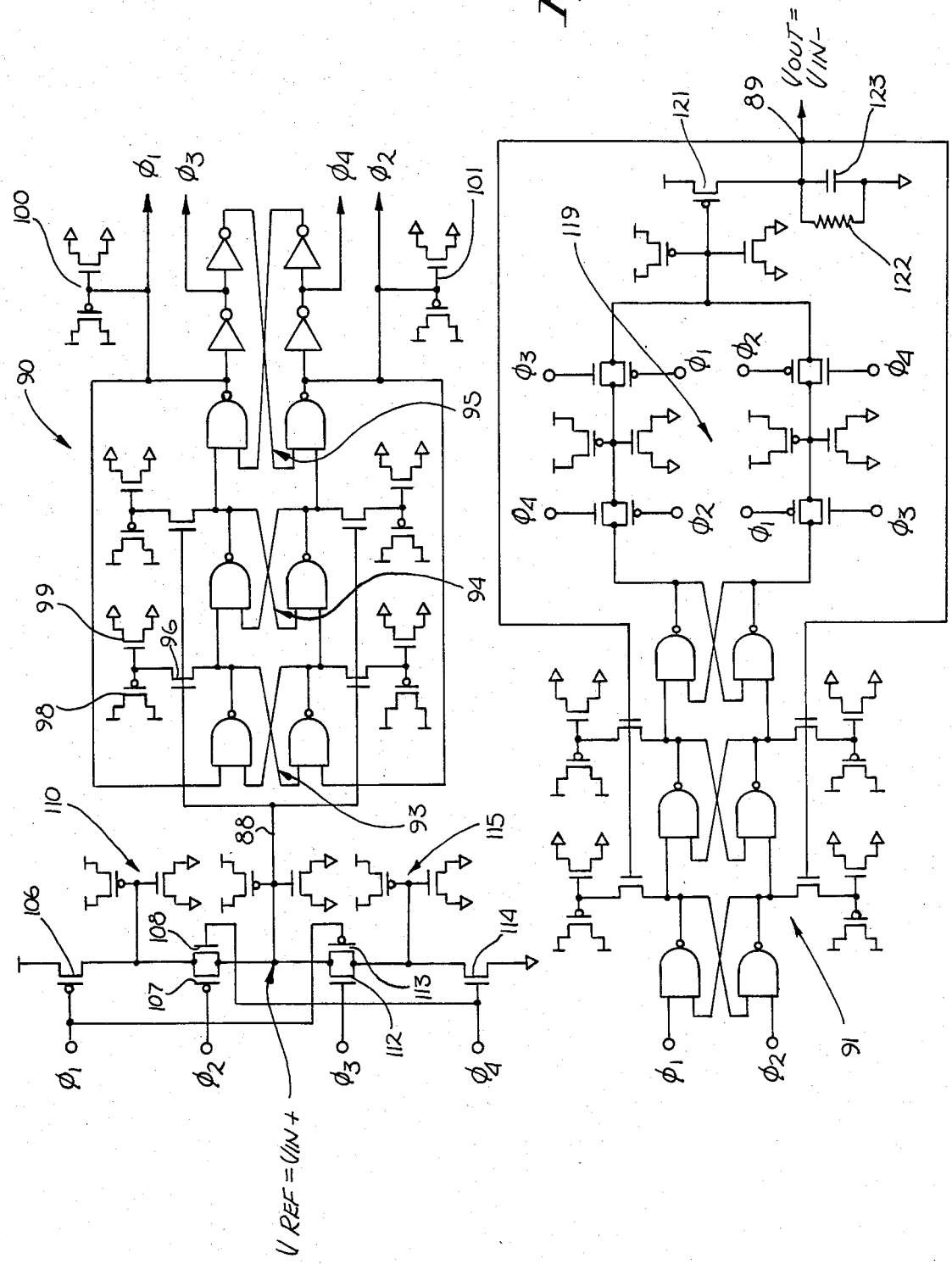
FIG. 4 is an electrical schematic showing the operational amplifier of the present invention used in a voltage regulator.

As will be seen from FIG. 4, the input lines 11 and 12 in the preferred embodiment are coupled to gates of MOS transistors, and thus the input resistance to the amplifier is very high.

The sample-and-hold circuit samples a voltage proportional to the difference of the two input voltages causing the common-mode gain of the amplifier (that is, the ratio of output voltage change to identical changes in input voltages) to be low. Low common-mode gain is one of the requirements for an operational amplifier.

An examination of the amplifier of FIG. 1 shows that it possesses the basic characteristics of an operational amplifier, that is, differential inputs, high differential gain, low common-mode gain, high input impedance, frequency compensation for closed-loop operation, and low output impedance can be provided with the buffer 26.

MOS REALIZATION OF THE OPERATIONAL AMPLIFIER

Figure 3:
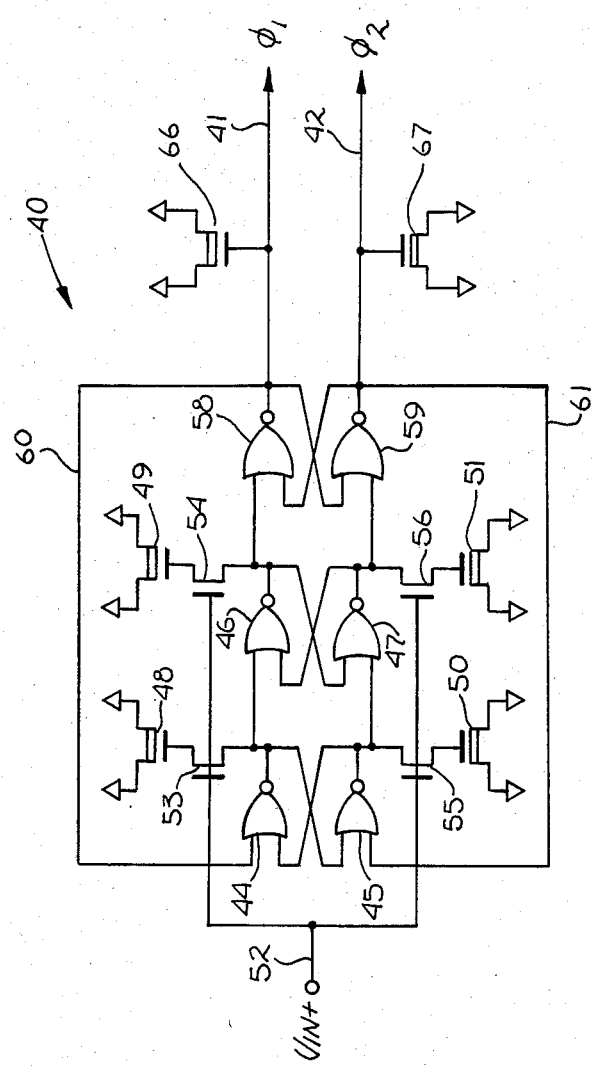
FIG. 3 is an electrical schematic showing a presently preferred embodiment of the present invention.
Figure 3:
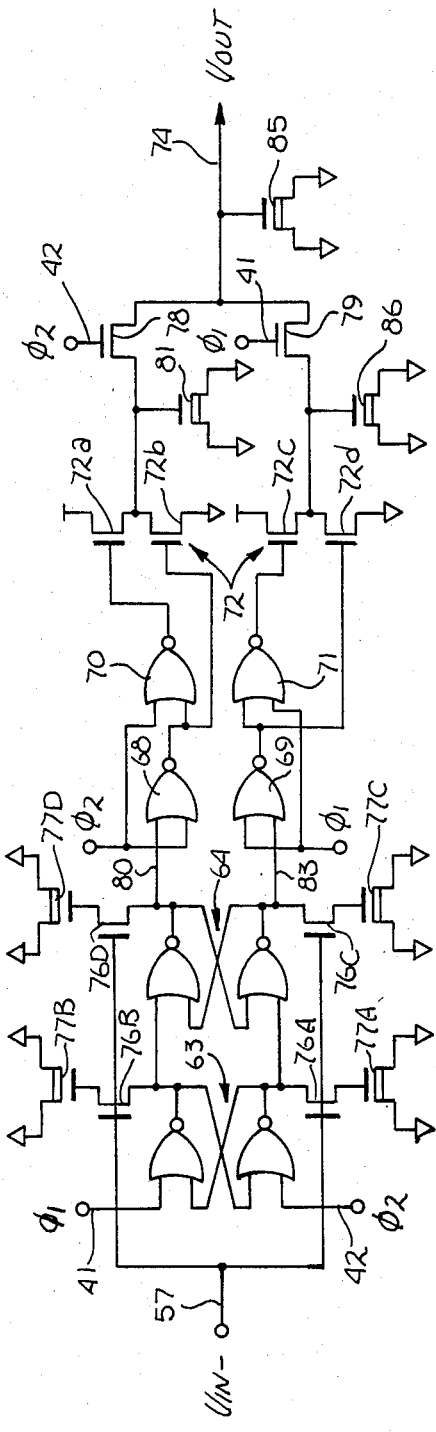

In FIG. 3, the invented operational amplifier is shown realized in one of its presently preferred embodiments using n-channel MOS transistors. The VCO 14 of FIG. 1 is shown as VCO 40 in FIG. 3. The outputs of the VCO 40 of FIG. 3 are complementary clocking signals $\phi_1$ (line 41) and $\phi_2$ (line 42). The input signal $V_{IN+}$ is coupled to the gates of transistors 53, 54, 55 and 56. These transistors control the amount of "loading" from the capacitors 48, 49, 50 and 51, respectively. The cross-coupled NOR gates 44 and 45 are coupled to transistors 53 and 55, and similarly, the cross-coupled NOR gates 46 and 47 are coupled to transistors 54 and 56. When the gates 44 and 45 switch between their two stable states they charge or discharge the two capacitors 48 or 50. The rate at which the capacitors charge or discharge is a function of the input potential on line 52.

If the potential on line 52 is high, the capacitors provide more loading at the outputs of the gates. Then more time is required for the signal to propagate from gate-to-gate. On the other hand, if the input potential on line 52 is low, the capacitors do not load the gates and the signal propagates quickly, thereby increasing the frequency of oscillation.

Assume the output of gate 44 attempts to go high. This high signal will not be propagated to the input of gates 45 or 46 until the output node of gate 44 can be sufficiently charged. If transistor 53 is not conducting heavily, capacitor 48 provides little load to the node, and the signal propagation occurs more quickly. Similarly, at the outputs of gates 46 and 47, transistors 54 and 56 control the loading by capacitors 49 and 51, respectively. This controls the speed of propagation of the signal to gates 58 and 59 and to the feedback path (lines 60 and 61 to gates 44 and 45). When $\phi_1$ goes high, it must propagate through the gates before the output of gate 59 can go high. Similarly, when $\phi_2$ goes high, it propagates (only after $\phi_1$ goes low) through the gates before the output of gate 58 goes high. Since, in the preferred embodiment, the propagation paths are identical, the two VCO outputs, $\phi_1$ and $\phi_2$, are symmetrical. The capacitors 66 and 67 are small trimming capacitors for equalizing the loading on lines 41 and 42 with the loading on gates 68 and 69. Without these capacitors, a DC offset potential may occur on the output line 74 (this offset potential can be observed by directly connecting the input line 57 to output line 74 and a reference voltage to line 52. This is the voltage follower configuration. The offset potential is the difference between the reference voltage and the voltage on line 74.) The value of the trimmer capacitors 66 and 67 is selected by simulating this voltage follower configuration and then adjusting the capacitors until the offset is removed.

The timing signals $\phi_1$ and $\phi_2$ on lines 41 and 42, respectively, provide timing signals for the second VCD circuit and for the sample-and-hold means shown in the lower half of FIG. 3. The second VCD circuit comprises the NOR gate pairs 63 and 64, this VCD circuit being identical (in layout) to the one incorporated within the VCO 40. The input signal on line 57 controls the loading from capacitors 77A, B, C, D through transistors 76A, B, C, D, respectively.

The sample-and-hold circuit and lowpass filter of FIG. 3 comprise the switched-capacitor network (NOR gates 68, 69, 70 and 71, the four buffer transistors 72, sampling transistors 78 and 79, and the associated capacitors.).

To understand the operation of the circuit of FIG. 3, assume that $\phi_1$ is transitioning to its high state while $\phi_2$ is transitioning to its low state. The $\phi_1$ signal propagates through the NOR gates 63 and 64 with the delay determined by the potential on line 57. Since the $\phi_2$ signal is low, the tristate buffer comprising the NOR gates 68 and 70 and the buffer transistors 72a and 72b are on, and amplify the output on line 80 from the VCD circuit. The tristate buffer comprising the NOR gates 69 and 71 and the transistors 72c and 72d are in their high impedance state, again since $\phi_1$ is high. When the $\phi_1$ goes low and $\phi_2$ goes high, the first tristate buffer (gates 68 and 70) ar in a high impedance state, and whatever potential was present at the output of the buffer at that instant is sampled and held on capacitor 81. In parallel, the same process starts in the VCD circuit with an output on line 83 and continues through the second tristate buffer. With $\phi_2$ high, capacitors 81 and 85 are connected and their charge redistributed. Similarly, with $\phi_1$ high, capacitors 845 and 86 are connected and again charge is redistributed. Thus, on each clock edge, one of the two switched-capacitor paths is activated, with the filtered output appearing on capacitor 85.

The time constant for the switched-capacitor network can be chosen to give stable closed-loop operation in a well-known manner. If simulated closed-loop operation provides inadequate damping, or even instability, the time constant can be increased by increasing the ratio of the capacitance between capacitors 85 and capacitors 81 and 86 (these capacitors have the same capacitance in the preferred embodiment). While doing this, the response time will be degraded (because of the increased time constant) but typically, the time constant will only be increased enough to insure adequate damping.

ON CHIP VOLTAGE REGULATOR IMPLEMENTED WITH THE INVENTED OPERATIONAL AMPLIFIER

One use for the invented operational amplifier is for an on-chip voltage regulator as shown in FIG. 4. In its preferred embodiment, the regulator is implemented with complementary MOS technology and thus includes n-channel enhancement-mode transistors and p-channel enhancement mode transistors. In FIG. 4, the p-channel transistors are those having the small circles above their gates.

Once again, two VCD circuits are used; circuit 90, which is included within a VCO, and circuit 91. The VCD circuits are implemented with NAND gates instead of the NOR gates of FIG. 3 since NAND gates switch faster with CMOS circuits than do NOR gates. Otherwise, the VCD circuits function in the same manner as the VCD circuits described in conjunction with FIG. 3.

The VCO comprises the six cross-coupled NAND gates pairs, 93, 94 and 95, the transistors used to control loading at the output nodes, such as transistor 96, and capacitors for providing loads, each of which comprises a pair of capacitors such as capacitors 98 and 99. The capacitors are implemented as complementary n-type and p-type pairs with equal gate areas for each conductivity type. The use of complementary pairs offsets the high nonlinear characteristics of enhancement mode transistors connected as capacitors. For gate voltages near or below the threshold voltage, the capacitance decreases sharply (nonlinearly) for enhancement mode transistors. With complementary pairs, one of the capacitors is always "on", and this provides compensation for the nonlinearity of the other capacitor. (For an NMOS embodiment, depletion-mode transistors are preferred for the capacitors since they are always "on" as long as the source and drain are grounded and the gate is above zero potential. This is true for the embodiment of FIG. 3 where, for instance, capacitors 48, 49, 50, 51 and those associated with the other VCD circuits are depletion-mode devices.)

Trimming capacitor pairs 100 and 101 may be used. These correspond to capacitors 66 and 67 of FIG. 3.

Figure 5:
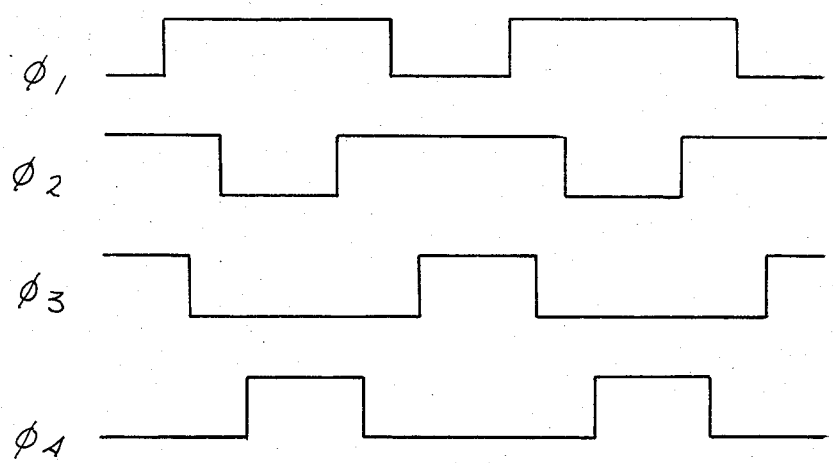
FIG. 5 illustrates timing signals for the operation of the circuit of FIG. 4.

The VCO of FIG. 4 produces 4 phases ($\phi_1$, $\phi_2$, $\phi_3$ and $\phi_4$) for use in the regulator circuit. The phase relationship of these signals is shown in FIG. 5. The frequency of oscillation of the VCO is controlled by the reference potential VREF which is a function of the supply potential, VCC.

The potential on node 88 is developed through a reference voltage generator which is a switched-capacitor network operating as a voltage divider. $V_{REF}$ is equal to $aV_{cc}$ where "a" is greater than zero but less than 1. Transistors 106, 107 and 108, along with the capacitor pair 110, form a switched-capacitor resistor coupled to $V_{cc}$ with a resistance equal to $1/fC_{110}$ where $C_{110}$ is the capacitance of the capacitor pair 110, and f is the frequency of oscillation of the VCO. Similarly, the transistors 112, 113 and 114, and the capacitor pair 115, form a switched-capacitor resistor connected to ground with a resistance equal to $1/fC_{115}$, where $C_{115}$ is the capacitance of capacitor pair 115. The capacitor pair at node 88 provides a load, and this load is substantially larger than that associated with the capacitor pairs 110 and 115. In a steady state condition, $V_{REF}$ is equal to the following:

$$V_{REF} = 1/fC_{115}V_{cc}/(1/fC_{110} + 1/fC_{115})$$
$$= C_{110}V_{cc}/(C_{110} + C_{115}).$$

In the embodiment of FIG. 4, the switched-capacitor sample-and-hold/lowpass filter circuit is realized using transmission gates (circuitry 119) as opposed to the tristate buffers used in FIG. 3. This is possible since the CMOS circuits allow the full zero to $V_{cc}$ range to be coupled, unlike the n-channel devices of FIG. 3 where a threshold voltage would be lost in the coupling process. (In the NMOS embodiment of FIG. 3, the use of tristate buffers prevents the loss of a threshold voltage during sampling). The output transistor 121 drives a load comprising the resistor 122 and capacitor 123.

The dominant s-plane pole of the circuit of FIG. 4 in closed loop operation should be selected during simulation such that it is sufficiently less than 1/RC (resistor 122, capacitor 123) to prevent unstable behavior.

The circuits of FIGS. 3 and 4 may be simulated prior to fabrication as is typically done using known techniques.

Thus, an operational amplifier has been described which employs a pair of delay circuits. The amplifier is particularly suitable for MOS fabrication since it provides adequate performance over a large range of temperature voltage supply and process variations.

I claim:

1. An MOS operational amplifier fabricated as an integrated circuit comprising:
    a voltage controlled oscillator (VCO) coupled to receive a first input signal to said amplifier, the frequency of oscillation of said oscillator being a function of said first input signal;
    a voltage controlled delay (VCD) means for providing a delay which is a function of a second input signal to said amplifier coupled to said amplifier, said VCD means being coupled to said VCO for delaying an oscillator signal from said VCO;
    a logic gate coupled to receive (i) the delayed oscillator signal from said VCD means and (ii) said oscillator signal;
    a sample-and-hold means for sampling a signal and for providing an output signal representative of said sampled signal, said sample-and-hold means being coupled to said logic gate and said VCO;
    whereby said amplifier provides adequate operational amplifier performance over a large range of variations in MOS processing, temperature and power supply potential.

2. The amplifier defined by claim 1 wherein said VCO includes a second VCD means, said first and second VCD means being substantially identical.

3. The amplifier defined by claim 2 wherein said logic means comprises an exclusive OR gate.

4. The amplifier defined by claim 2 including a low-pass filter coupled to receive said output from said sample-and-hold means.

5. The amplifier defined by claim 2 or 4 wherein said first and second VCD's each comprise a plurality of cross-coupled gates.

6. The amplifier defined by claim 5 wherein capacitors are coupled to the output nodes of said gates.

7. The amplifier defined by claim 6 wherein said input signals control the coupling between said output nodes and said capacitors.

8. The amplifier defined by claim 7 wherein each one of said capacitors comprises a pair of p-channel and n-channel enhancement-mode device.

9. An MOS operational amplifier fabricated as an integrated circuit comprising:
    a voltage controlled oscillator (VCO) which includes a first voltage control delay (VCD) means for delaying a signal as a function of a first input signal coupled to said first VCD means, the frequency of the output signal from said VCO being a function of said delay of said first VCD means;
    a second VCD means for delaying a signal as a function of a second input signal, said second VCD being coupled to receive said VCO output signal;
    a logic gate coupled to receive as inputs said VCO output signal and said delayed VCO output signal from said second VCD means;
    a sample-and-hold means for sampling the output of said logic means on command of said VCO output signals, said sample-and-hold means being coupled to said logic gates and said VCO;
    whereby the output of said sample-and-hold means provides a signal representative of the difference between said first and second input signals.

10. The amplifier defined by claim 9 wherein said first VCD means and said second VCD means are identical.

11. The amplifier defined by claim 10 including a lowpass filter coupled to receive the output of said sample-and-hold means.

12. The amplifier defined by claim 10 or 11 wherein said delays of said first and second VCD means are obtained through use of capacitors.

13. The amplifier defined by claim 12 wherein each of said capacitors comprise a pair of n-channel and p-channel enhancement-mode device.

* * * * *